(12) United States Patent
Bates et al.

(10) Patent No.: US 7,885,147 B2
(45) Date of Patent: Feb. 8, 2011

(54) APPARATUS AND METHOD TO STORE INFORMATION IN A HOLOGRAPHIC DATA STORAGE MEDIUM

(75) Inventors: Allen Keith Bates, Tucson, AZ (US); Nils Haustein, Mainz (DE); Craig Anthony Klein, Tuscon, AZ (US); Daniel James Winarski, Tuscon, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/784,444

(22) Filed: May 20, 2010

(65) Prior Publication Data

US 2010/0232280 A1    Sep. 16, 2010

Related U.S. Application Data

(63) Continuation of application No. 11/773,239, filed on Jul. 3, 2007, now Pat. No. 7,724,613.

(51) Int. Cl.
    *G11B 21/08*    (2006.01)
(52) U.S. Cl. .................................................. 369/30.03
(58) Field of Classification Search ........................ None
    See application file for complete search history.

(56) References Cited

U.S. PATENT DOCUMENTS

| | | | |
|---|---|---|---|
| 4,918,677 A | 4/1990 | Ashinuma et al. | |
| 5,023,854 A | 6/1991 | Satoh et al. | |
| 5,214,627 A | 5/1993 | Nakashima et al. | |
| 5,452,282 A | 9/1995 | Abraham | |
| 5,566,387 A | 10/1996 | Dewald | |
| 6,078,559 A | 6/2000 | Takemura et al. | |
| 6,483,650 B1 | 11/2002 | Imai | |
| 6,606,294 B2 | 8/2003 | Takemura et al. | |
| 2008/0008076 A1* | 1/2008 | Raguin et al. ............... | 369/103 |
| 2008/0253257 A1* | 10/2008 | Stallinga ..................... | 369/103 |
| 2008/0266623 A1* | 10/2008 | Bates et al. .................... | 359/3 |
| 2008/0279061 A1 | 11/2008 | Ogasawara et al. | |

* cited by examiner

*Primary Examiner*—Joseph H Feild
*Assistant Examiner*—Henok Heyi
(74) *Attorney, Agent, or Firm*—Dale F. Regelman; Quarles & Brady LLP

(57) ABSTRACT

A method to provide data storage services using one or more holographic data storage media disposed in a holographic data storage system operated by a data storage services provider, wherein the holographic data storage system comprises a light source, a spatial light modulator, and a plurality of holographic data storage media, wherein the method receives information provided by the data storage services customer, allocates a first holographic data storage medium for exclusive storage of information provided by the data storage services customer, defines an outer storage portion of the first allocated holographic data storage medium, and stores the information as one or more holograms encoded in the outer storage portion of the first holographic data storage medium.

9 Claims, 15 Drawing Sheets

APPARATUS AND METHOD TO STORE INFORMATION IN A HOLOGRAPHIC DATA STORAGE MEDIUM

CROSS-REFERENCE TO RELATED APPLICATION

This application is a Continuation Application claiming priority from the application Ser. No. 11/773,239, now U.S. Pat. No. 7,724,613.

FIELD OF THE INVENTION

This invention relates to an apparatus and method to store information in a holographic data storage medium.

BACKGROUND OF THE INVENTION

In holographic information storage, an entire page of information is stored at once as an optical interference pattern within a thick, photosensitive optical material. This is done by intersecting two coherent laser beams within the storage material. The first, called the data beam, contains the information to be stored; the second, called the reference beam, is designed to be simple to reproduce, for example a simple collimated beam with a planar wavefront.

The resulting optical interference pattern causes chemical and/or physical changes in the photosensitive medium: a replica of the interference pattern is stored as a change in the absorption, refractive index, or thickness of the photosensitive medium. When the stored interference pattern is illuminated with one of the two waves that were used during recording, some of this incident light is diffracted by the stored interference pattern in such a fashion that the other wave is reconstructed. Illuminating the stored interference pattern with the reference wave reconstructs the data beam, and vice versa.

A large number of these interference patterns can be superimposed in the same thick piece of media and can be accessed independently, as long as they are distinguishable by the direction or the spacing of the patterns. Such separation can be accomplished by changing the angle between the object and reference wave or by changing the laser wavelength. Any particular data page can then be read out independently by illuminating the stored patterns with the reference wave that was used to store that page. Because of the thickness of the hologram, this reference wave is diffracted by the interference patterns in such a fashion that only the desired object beam is significantly reconstructed and imaged on an electronic camera. The theoretical limits for the storage density of this technique are on the order of tens of terabits per cubic centimeter.

SUMMARY OF THE INVENTION

A method is presented to provide data storage services by a data storage services provider to a data storage services customer by storing information in one or more holographic data storage media disposed in a holographic data storage system operated by the data storage services provider, wherein the holographic data storage system comprises a light source, a spatial light modulator, and a plurality of holographic data storage media, wherein the method receives by the data storage services provider information provided by the data storage services customer, allocates a first holographic data storage medium for exclusive storage of information provided by the data storage services customer, defines an outer storage portion of the first allocated holographic data storage medium, and stores the information as one or more holograms encoded in the outer storage portion of the first holographic data storage medium.

An article of manufacture is presented. The article of manufacture is operated by a data storage services provider and comprises a light source, a spatial light modulator, a plurality of holographic data storage media, and a computer readable medium having computer readable program code disposed therein to provide data storage services to one or more data storage services customers by storing information in one or more holographic data storage media, the computer readable program code comprising a series of computer readable program steps to effect receiving by the data storage services provider information provided by the data storage services customer, allocating a first holographic data storage medium for exclusive storage of information provided by the data storage services customer, defining an outer storage portion of the first allocated holographic data storage medium, and storing the information as one or more holograms encoded in the outer storage portion of the first holographic data storage medium.

A computer program product encoded in a computer readable medium is presented. The computer program product is usable with a programmable computer processor disposed in a holographic data storage system owned and/or operated by a data storage services provider and comprising a light source, a spatial light modulator, and a plurality of holographic data storage media. The computer program product comprises computer readable program code which causes the programmable computer processor to receive information provided by the data storage services customer, allocate a first holographic data storage medium for exclusive storage of information provided by the data storage services customer, define an outer storage portion of the first allocated holographic data storage medium, and store the information as one or more holograms encoded in the outer storage portion of the first holographic data storage medium.

BRIEF DESCRIPTION OF THE DRAWINGS

The invention will be better understood from a reading of the following detailed description taken in conjunction with the drawings in which like reference designators are used to designate like elements, and in which.

DETAILED DESCRIPTION OF THE PREFERRED EMBODIMENTS

This invention is described in preferred embodiments in the following description with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of the invention may be combined in any suitable manner in one or more embodiments. In the following description, numerous specific details are recited to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 3:
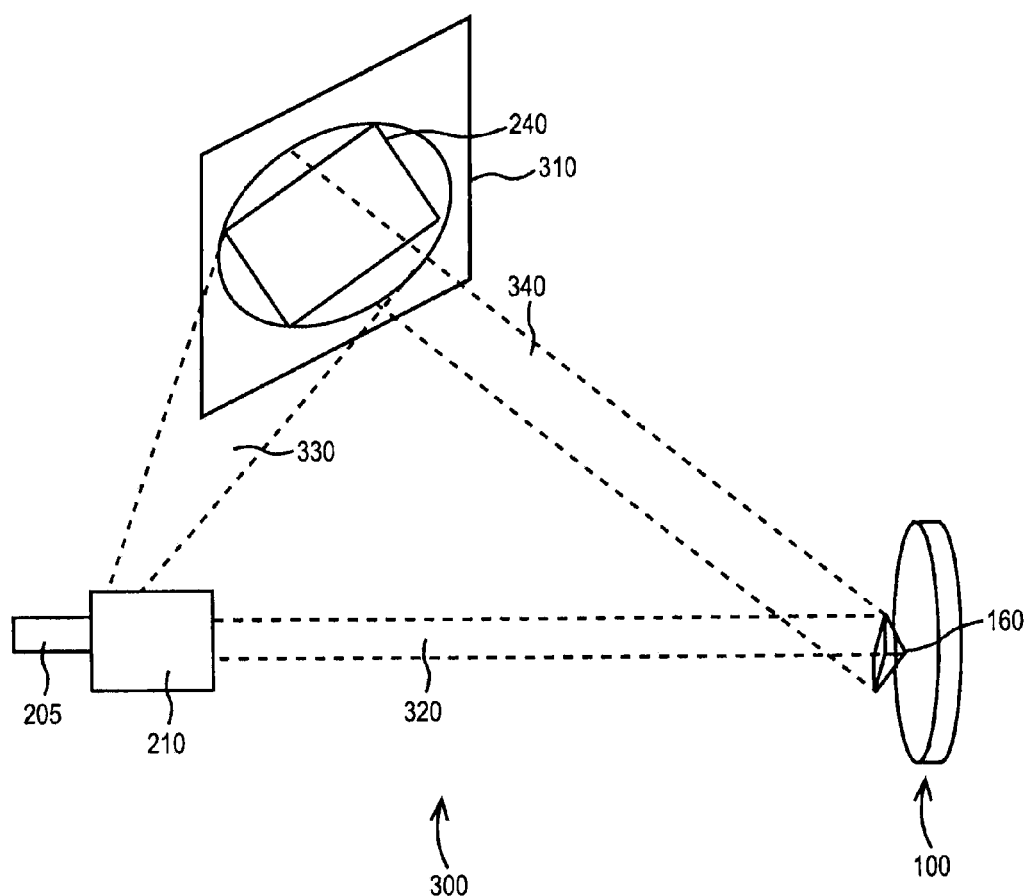
FIG. 3 is a block diagram showing Applicants' holographic data storage system being used to encode information in a holographic data storage medium.
Figure 4:
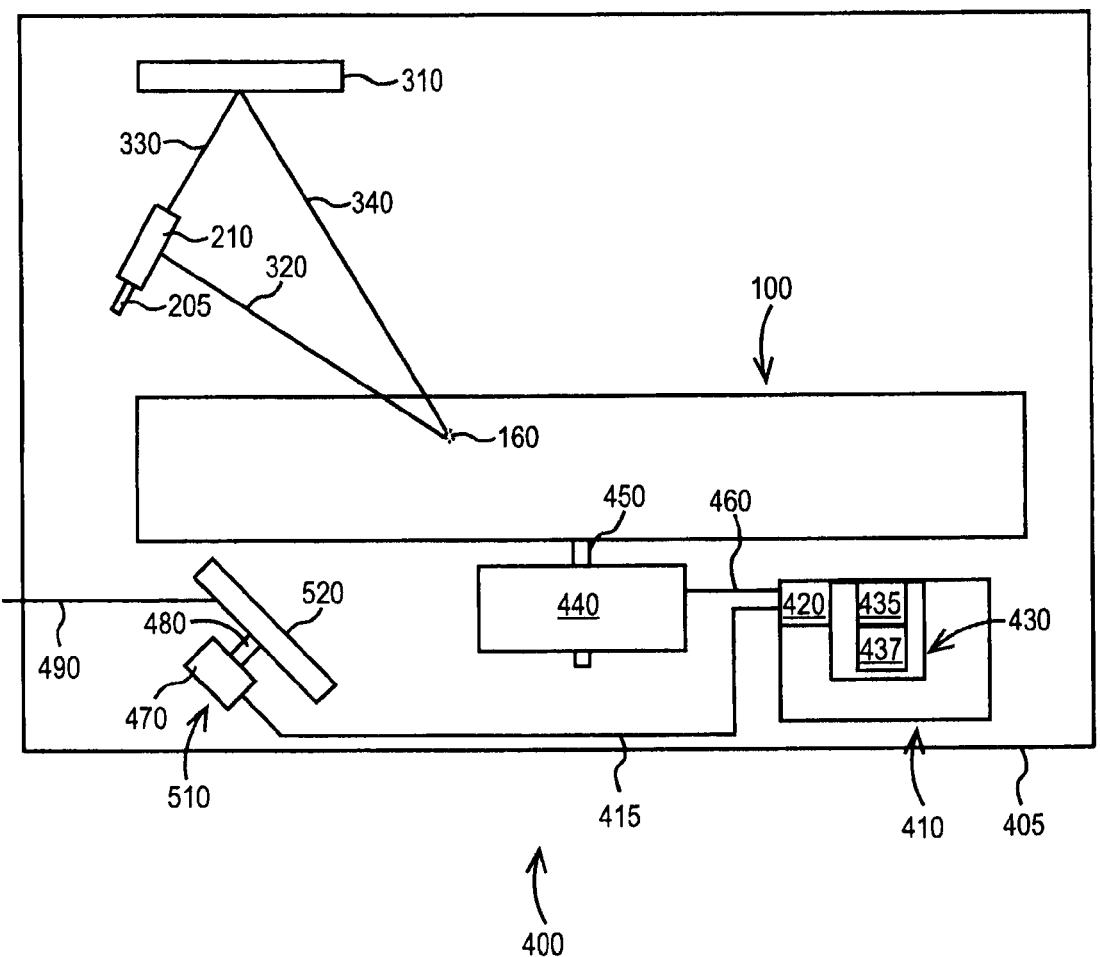
FIG. 4 is a block diagram showing the elements of FIG. 3 disposed in a holographic drive, wherein the holographic drive is shown encoding a hologram into a holographic data storage medium.
Figure 5:
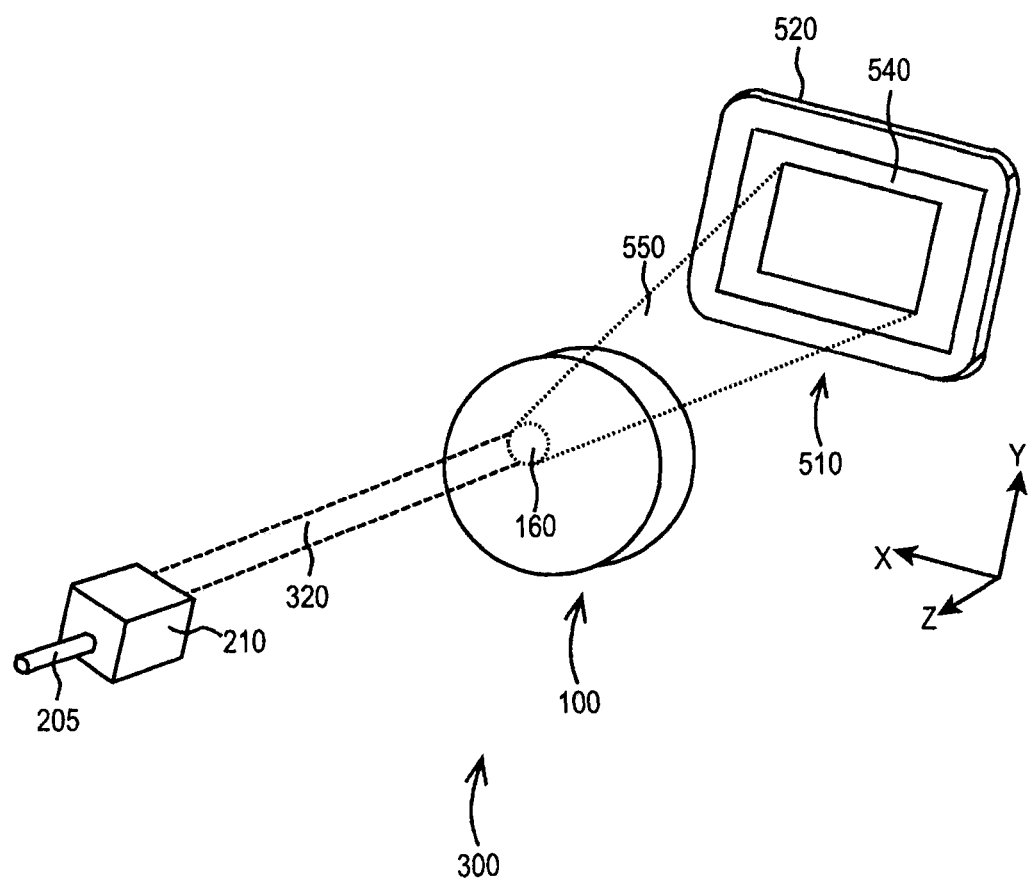
FIG. 5 is a block diagram showing Applicants' holographic data storage system being used to decode information encoded in a holographic data storage medium.

Referring now to FIGS. 3 and 5, holographic data storage system 300 comprises laser light source 205, beam splitter 210, reflective spatial light modulator 310 (FIG. 3), holographic storage medium 100, and optical sensor array 510 (FIGS. 4, 5, 6) which comprises input screen 520 (FIGS. 4, 5, 6, 9, 10, 11). The light generated by source 205 is split by beam splitter 210 into reference beam 320, and carrier beam 330 (FIG. 3).

In the illustrated embodiment of FIG. 3, reflective spatial light modulator ("RSLM") 310 displays image 240. In certain embodiments, reflective spatial light modulator 310 comprises an assembly comprising a plurality of micro mirrors. In other embodiments, reflective spatial light modulator 310 comprises a liquid crystal on silicon ("LCOS") display device. In contrast to nematic twisted liquid crystals used in LCDs, in which the crystals and electrodes are sandwiched between polarized glass plates, LCOS devices have the liquid crystals coated over the surface of a silicon chip. The electronic circuits that drive the formation of the image are etched into the chip, which is coated with a reflective (aluminized) surface. The polarizers are located in the light path both before and after the light bounces off the chip. LCOS devices are easier to manufacture than conventional LCD displays. LCOS devices have higher resolution because several million pixels can be etched onto one chip. LCOS devices can be much smaller than conventional LCD displays.

Carrier beam 330 picks up image 240 as the light is reflected off reflective spatial light modulator 310 to form reflected data beam 340 comprising image 240. Unreflected reference beam 320 interferes with reflected data beam 340 to form hologram 160 within holographic storage medium 100. Hologram 160 is encoded into holographic data storage medium 100 as an interference pattern.

FIG. 5 illustrates holographic data storage system 300 decoding the interference pattern comprising the encoded hologram 160 stored in media 100. Input screen 520 (FIGS. 4, 5, 6, 9, 10, 11) is disposed a distance away from holographic storage medium 100 sufficient to digitally capture the reconstructed data beam 550 projected upon it. To decode the interference pattern comprising hologram 160 (FIGS. 3, 4, 5, 6, 10), reference beam 320 is incident on the encoded holographic storage medium 100. As the reference beam 320 interferes with the interference pattern, a reconstructed data beam 550 is generated, wherein that reconstructed data beam 550 comprises an image 540 resembling the original image 240. Optical sensor array 510 (FIGS. 4, 5, 6) digitally captures the information comprising image 540 on input screen 520.

Figure 6:
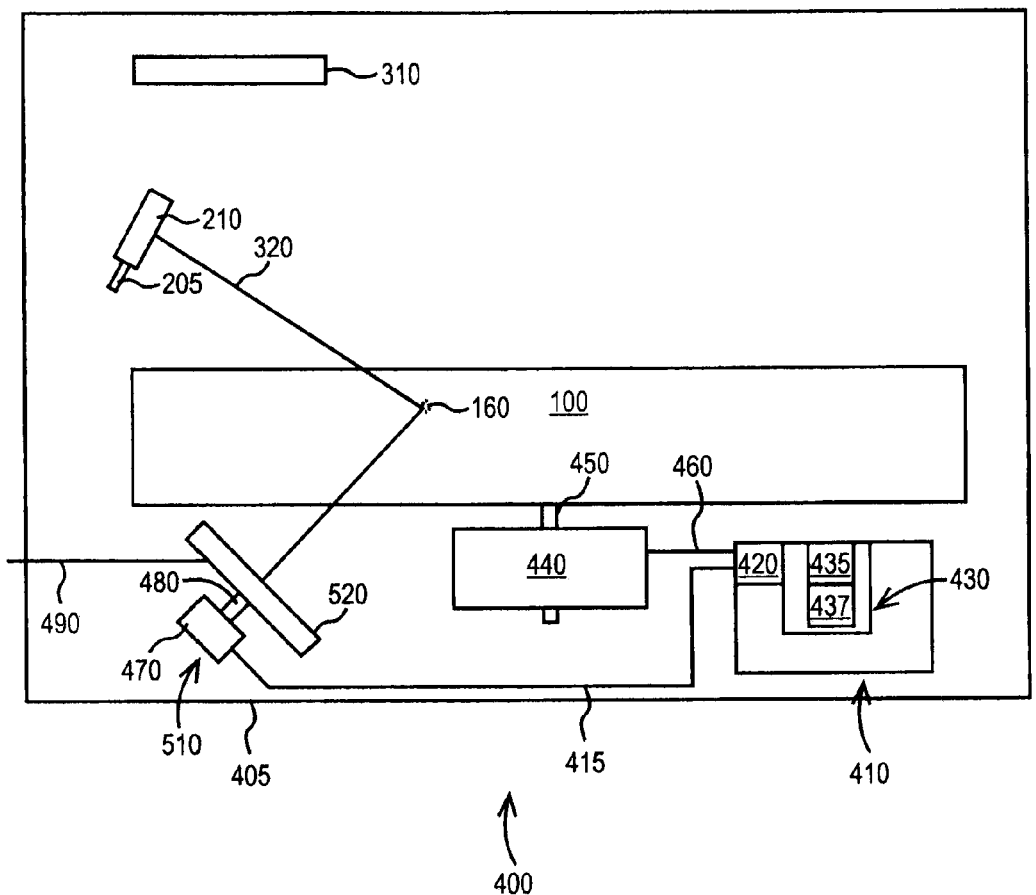
FIG. 6 is a block diagram showing the holographic drive of FIG. 5 being used to decode a hologram encoded in a holographic data storage medium.

Referring now to FIGS. 4 and 6, in certain embodiments laser light source 205, beam splitter 210, reflective spatial light modulator 310, and optical sensor array 510, are disposed within holographic drive apparatus 400. In the illustrated embodiment of FIGS. 4 and 6, holographic drive apparatus 400 further comprises housing 405.

In certain embodiments, holographic data storage medium 100 can be removeably disposed within housing 405. In the illustrated embodiment of FIGS. 4 and 6, holographic data storage medium 100 is releaseably attached to a drive servo mechanism comprising drive servo 440 and rotatable shaft 450. Drive servo 440 rotates rotatable shaft 450 thereby causing holographic data storage medium 100 to rotate also.

Optical sensor array 510 comprises rotation-error-servo ("RES") 470. As those skilled in the art will appreciate, a servo comprises a device comprising an external shaft, such as rotatable shaft 480. Rotatable shaft 480 can be positioned to specific angular positions by sending RES 470 a pre-defined coded signal. As long as that coded signal exists on input line 415, RES 470 will maintain the associated angular position of shaft 480. As the coded signal changes, the angular position of the shaft 480 changes.

RES 470 is interconnected by rotatable shaft 480 to rear portion of input screen 520 (FIGS. 4, 5, 6, 9, 10, 11). RES 470 can cause input screen 520 to rotate in a first direction, i.e. clockwise, or to rotate in a second and opposite direction, i.e. counter-clockwise, by causing rotatable shaft 480 to rotate in the first direction or in the second direction, respectively.

In the illustrated embodiment of FIGS. 4 and 6, holographic drive apparatus 400 further comprises drive controller 410. Drive controller 410 comprises programmable computer processor 420, memory 430, and microcode 435 written to memory 430. Drive controller 410 is interconnected with drive servo 440 via communication link 460, and with RES 470 via communication link 415. Drive controller 410, using programmable computer processor 420 and microcode 435, can cause holographic data storage medium 100 to rotate at a first rotation rate, and can simultaneously cause input screen 520 (FIGS. 4, 5, 6, 9, 10, 11) to rotate at a second rotation rate, wherein the first rotation rate may equal the second rotation rate, and wherein the first rotation rate may differ from the second rotation rate.

In certain embodiments, memory 430 comprises non-volatile memory, such as and without limitation, battery backed-up RAM; a magnetic disk in combination with the associated software, firmware, and hardware, to read information from, and write information to, that magnetic disk; an optical disk in combination with the associated software, firmware, and hardware, to read information from, and write information to, that optical disk; an electronic storage medium; and the like. By "electronic storage medium," Applicants mean, for example, a device such as a PROM, EPROM, EEPROM, Flash PROM, compactflash, smartmedia, and the like.

FIG. 4 shows holographic drive apparatus 400 being used to encode hologram 160 as an interference pattern in holographic data storage medium 100. FIG. 6 shows holographic drive apparatus 400 being used to decode the interference pattern comprising hologram 160. In the illustrated embodiment of FIGS. 4 and 6, sensor array 510 outputs information using communication link 490. In certain embodiments, communication link 490 is interconnected with one or more host computers. In certain embodiments, communication link 490 is interconnected with a storage controller, such as for example storage controller 760 (FIG. 7).

Figure 7:
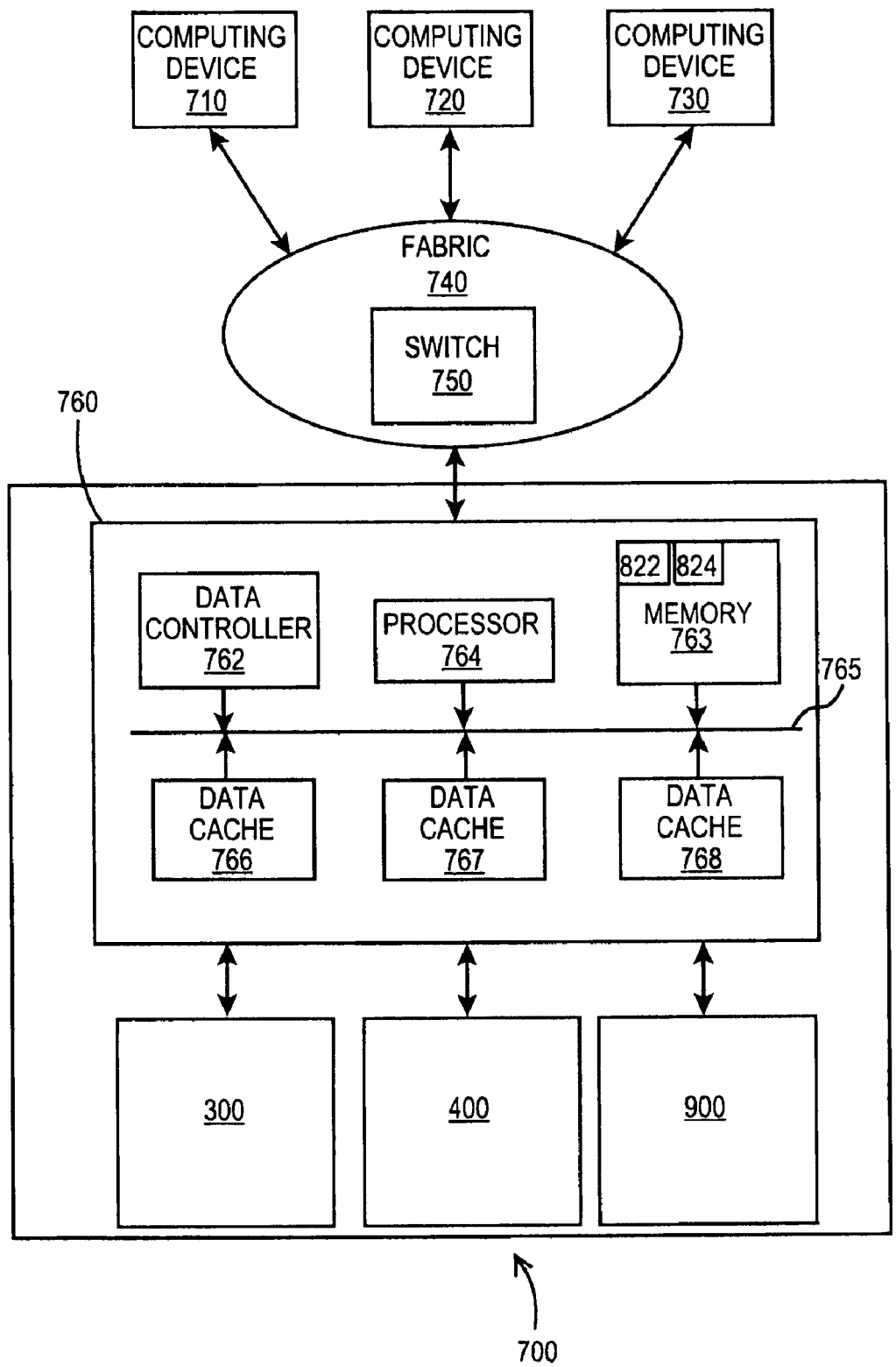
FIG. 7 is a block diagram showing one embodiment of Applicants' data storage and retrieval system.
Figure 9:
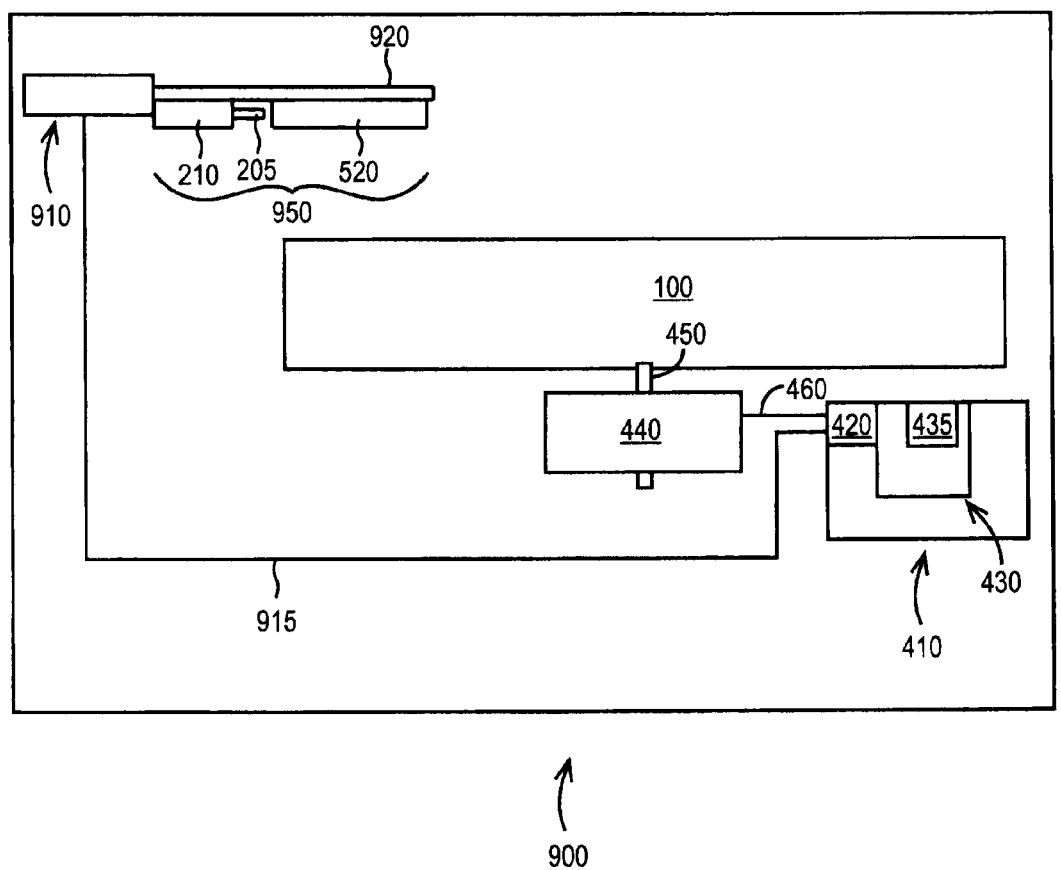
FIG. 9 is a block diagram showing Applicants' holographic drive comprising a moveable read head disposed in a first position.
Figure 10:
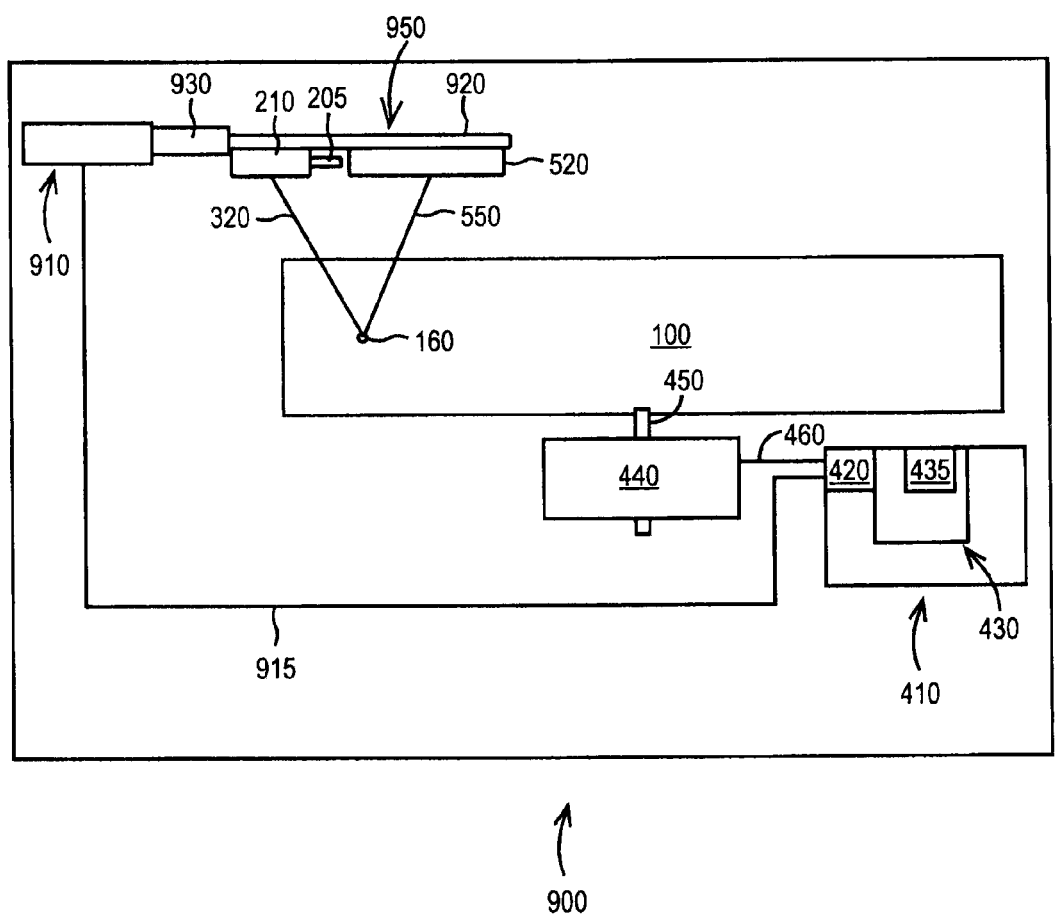
FIG. 10 is a block diagram showing the holographic drive of FIG. 9 being used to decode a hologram encoded in the outer storage portion of a holographic data storage medium.
Figure 11:
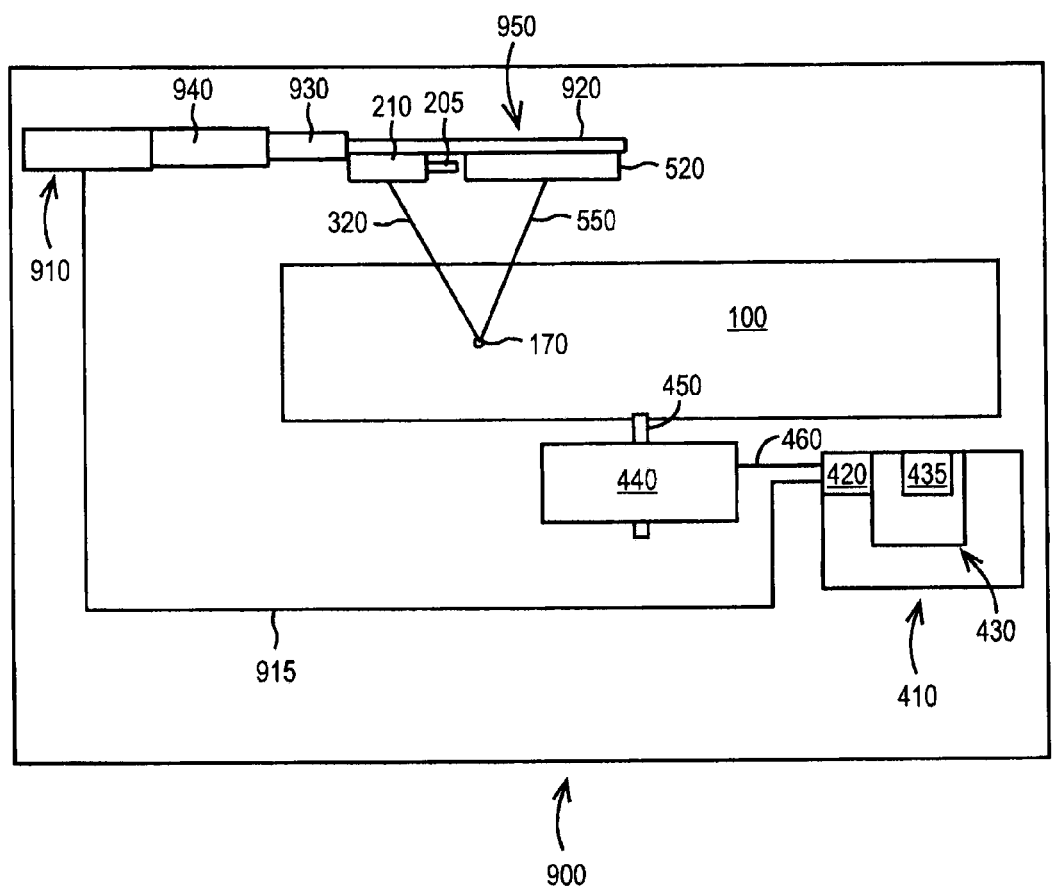
FIG. 11 is a block diagram showing the holographic drive of FIG. 9 being used to decode a hologram encoded in the inner storage portion of a holographic data storage medium.

FIG. 7 illustrates one embodiment of Applicants' data storage and retrieval system 700. In the illustrated embodiment of FIG. 7, data storage and retrieval system 700 communicates with computing devices 710, 720, and 730. In the illustrated embodiment of FIG. 7, computing devices 710, 720, and 730 communicate with storage controller 760 through a data communication fabric 740. In certain embodiments, fabric 740 comprises one or more data switches 750. Further in the illustrated embodiment of FIG. 7, storage controller 760 communicates with one or more holographic data storage systems. In the illustrated embodiment of FIG. 7, data storage and retrieval system 700 comprises holographic data storage system 300 (FIGS. 3, 5), holographic drive 400 (FIGS. 4, 6), and holographic drive 900 (FIGS. 9, 10, 11).

In certain embodiments, computing devices 710, 720, and 730, are selected from the group consisting of an application server, a web server, a work station, a host computer, or other like device from which information is likely to originate. In certain embodiments, one or more of computing devices 710, 720, and/or 730 are interconnected with fabric 740 using Small Computer Systems Interface ("SCSI") protocol running over a Fibre Channel ("FC") physical layer. In other embodiments, the connections between computing devices 710, 720, and 730, comprise other protocols, such as Infiniband, Ethernet, or Internet SCSI ("iSCSI"). In certain embodiments, switches 750 are configured to route traffic from the computing devices 710, 720, and/or 730, directly to the storage controller 760.

In the illustrated embodiment of FIG. 7, storage controller 760 comprises a data controller 762, memory 763, microcode 822, instructions 824, programmable computer processor 764, and data caches 766, 767, and 768, wherein these components communicate through a data bus 765. In certain embodiments, memory 763 comprises a magnetic information storage medium, an optical information storage medium, an electronic information storage medium, and the like. By "electronic storage media," Applicants mean, for example, a device such as a PROM, EPROM, EEPROM, Flash PROM, compactflash, smartmedia, and the like.

In certain embodiments, the storage controller 760 is configured to read data signals from and write data signals to a serial data bus on one or more of the computing devices 710, 720, and/or 730. Alternatively, in other embodiments the storage controller 760 is configured to read data signals from and write data signals to one or more of the computing devices 710, 720, and/or 730, through the data bus 765 and the fabric 740.

In certain embodiments, storage controller 760 converts a serial data stream into a convolution encoded images. Those images are transferred to RSLM 310 (FIGS. 3, 4, 6).

Figure 1:
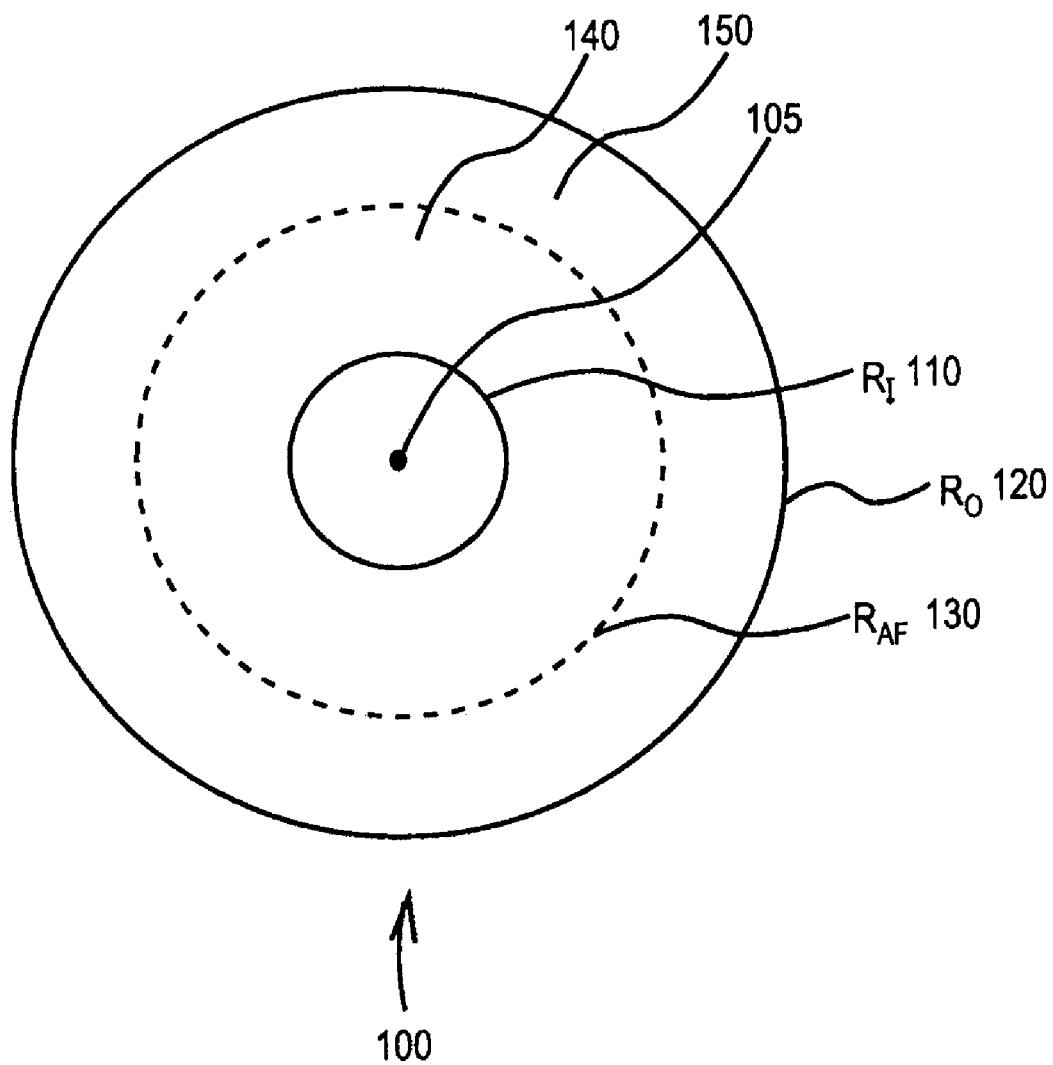
FIG. 1 is top view of a holographic data storage medium.

FIG. 1 illustrates holographic data storage medium 100 comprising geometric center-of-disk 105. A plurality of interference patterns can be encoded within holographic data storage medium between the inner radius $R_I$ 110 and the outer radius $R_O$ 120. Active-Fossil boundary radius $R_{AF}$ 130 comprises the half-capacity radius of holographic data storage medium 100, wherein that $R_{AF}$ 130 is calculated using Equation (1).

$$R_{AF} = [(R_O^2 - R_I^2)/2]^{1/2} \qquad (1)$$

Applicants' method stores Active information as one or more holograms encoded between the $R_{AF}$ and the $R_O$ of a holographic data storage medium. Active hologram storage portion 150 of holographic data storage medium 100 is defined by Active-Fossil boundary radius $R_{AF}$ 130 and outer radius $R_O$ 120. For purposes of this application, a hologram encoded within portion 150 comprises an "Active Hologram."

Applicants' method stores Fossil information as one or more holograms encoded between the $R_I$ and the $R_{AF}$ of a holographic data storage medium. Fossil hologram storage portion 140 of holographic data storage medium 100 is defined by Active-Fossil boundary radius $R_{AF}$ 130 and inner radius $R_I$ 110. For purposes of this application, a hologram encoded within portion 140 comprises a "Fossil Hologram."

Figure 2:
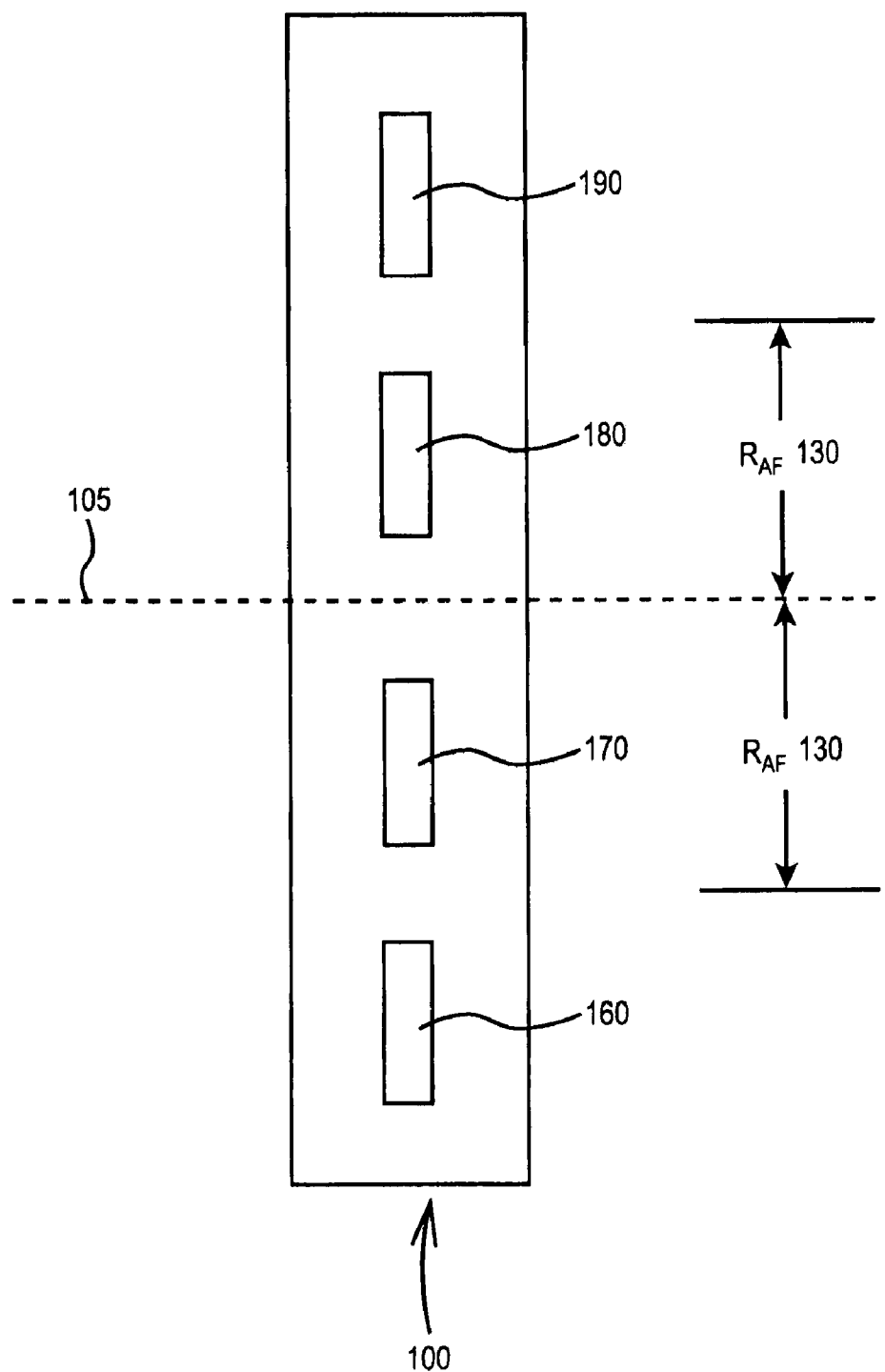
FIG. 2 is a cross-sectional view of the holographic data storage medium of FIG. 1.

Referring now to FIG. 2, holograms 170 and 180 are encoded within Fossil hologram storage portion 140 (FIG. 1) of holographic data storage medium 100, and therefore, comprise "Fossil Holograms." Holograms 160 and 190 are encoded within Active hologram storage portion 150 (FIG. 1) of holographic data storage medium 100, and therefore, comprise "Active Holograms."

In certain embodiments, Applicants' holographic drive 400 (FIGS. 4, 6) and holographic drive 900 (FIGS. 9, 10, 11) utilize a constant-linear-velocity ("CLV") wherein the angular velocity of the holographic data storage medium is inversely proportional to the radius. As a result, the angular velocity of the holographic data storage medium is lower during read operations because Applicants' method encodes the Active Holograms in the Active hologram storage portion 150 (FIG. 1) of the holographic data storage medium, where the power consumption by drive servo 440 is lower due to this lower angular velocity.

Referring now to FIG. 9, in certain embodiments Applicants' holographic drive 900 comprises member 920 attached to solenoid/motor 910, wherein drive controller 410 can cause solenoid/motor 910 to extend member 920 outwardly via link 915. Laser light source 205, beam splitter 210, and optical sensor array 520 (FIGS. 4, 5, 6, 9, 10, 11), are disposed on member 920. Member 920 in combination with Laser light source 205, beam splitter 210, and optical sensor array 520, comprise holographic read head 950.

In the illustrated embodiment of FIG. 10, holographic read head 950 has been moved laterally by extension member 930. Further in the illustrated embodiment of FIG. 10, reference beam 320 is shown interfering with an interference pattern comprising Active Hologram 160 (FIGS. 2, 12) to form reconstructed data beam 550 (FIGS. 5, 10) which comprises the image encoded in Active Hologram 160. Reconstructed data beam 550 is projected onto input screen 520 (FIGS. 4, 5, 6, 9, 10, 11).

In the illustrated embodiment of FIG. 11, holographic read head 950 has been moved further laterally by extension members 930 and 940. Further in the illustrated embodiment of FIG. 11, reference beam 320 is shown interfering with encoded Fossil Hologram 170 (FIGS. 2, 12) to form reconstructed data beam 550 (FIGS. 5, 10, 11) which comprises the image encoded in Fossil Hologram 170. Reconstructed data beam 550 is projected onto input screen 520 (FIGS. 4, 5, 6, 9, 10, 11).

Figure 12:
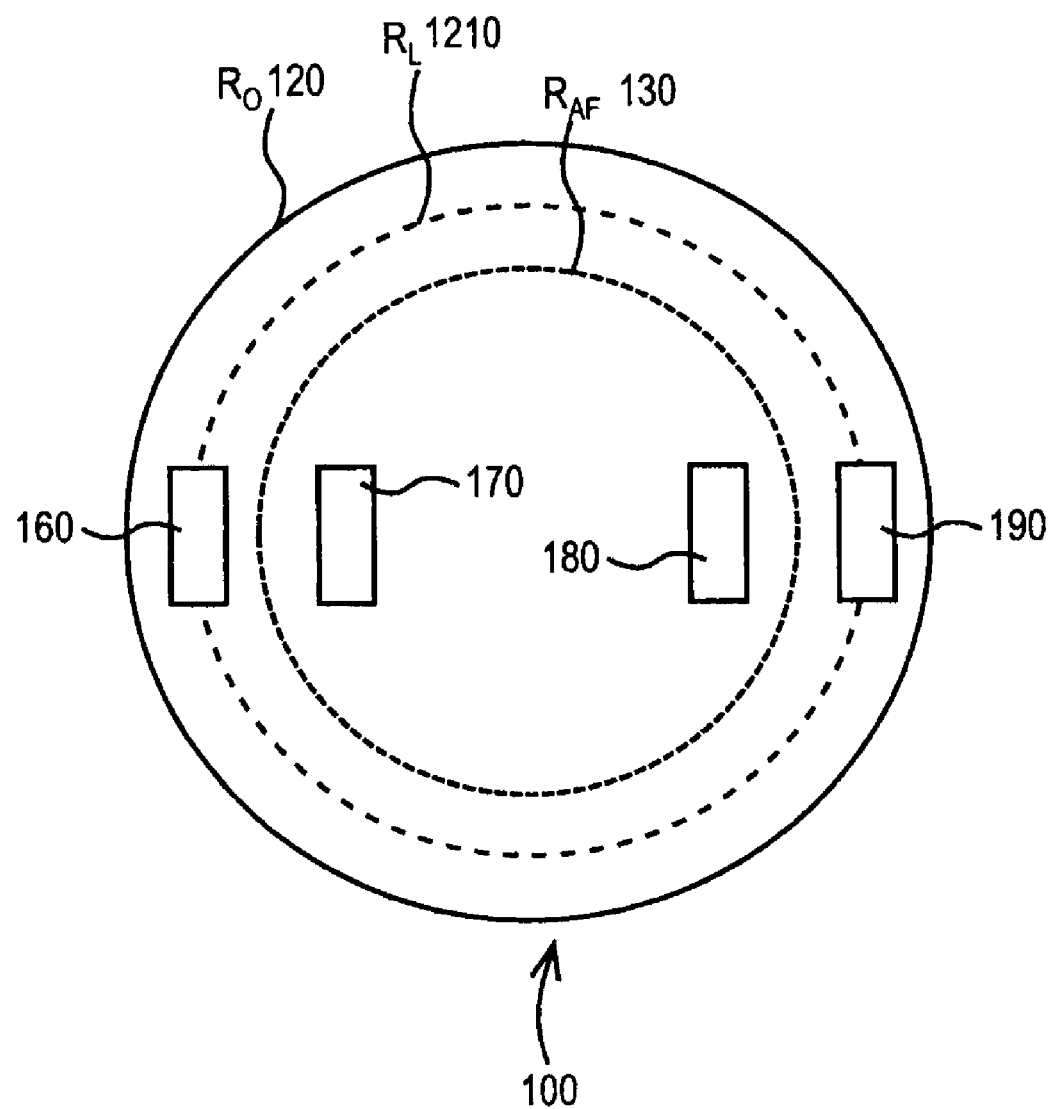
FIG. 12 is a top view of the holographic data storage medium of FIG. 1 showing Applicants' Loitering Radius $R_L$ 1210.

Referring now to FIG. 12, in certain embodiments, Applicants' method positions Applicants' holographic read head 950 (FIGS. 9, 10, 11) above Read-Loiter radius $R_L$ 1210. Radius $R_L$ comprises the mid-capacity point between outer radius $R_O$ 120 and Active-Fossil boundary radius $R_{AF}$ 130. Applicants have found that radius $R_L$ 1210 comprises the optimal position for Applicants' holographic read head for random reads of Active Holograms encoded in the Active hologram storage portion 150 (FIG. 1) of holographic data storage medium 100. If Applicants' holographic read head is positioned at radius $R_L$, then the directional-probability of a seek to a random file is 50% inwards from, and 50% outwards from, that loitering position.

For a holographic data storage medium comprising no unused storage capacity, i.e. a "filled" storage medium, the Read-Loiter radius $R_L$ 1210 is defined by Equation (2).

$$R_L = [(R_O^2 - R_{AF}^2)/2]^{1/2} \quad (2)$$

If the holographic data storage medium is not filled, radius $R_{AF}$ is assigned a value corresponding to the innermost radius at which a Active Hologram is encoded. Thus, $R_L$ 1210 will vary as holographic data storage medium 100 has Active Holograms encoded therein.

Applicants' invention comprises an apparatus and method to store information using a holographic data storage medium. In certain embodiments, Applicants' method stores in one holographic data storage medium both active information and fossilized information, i.e. historical information that is not routinely accessed.

Figure 13:
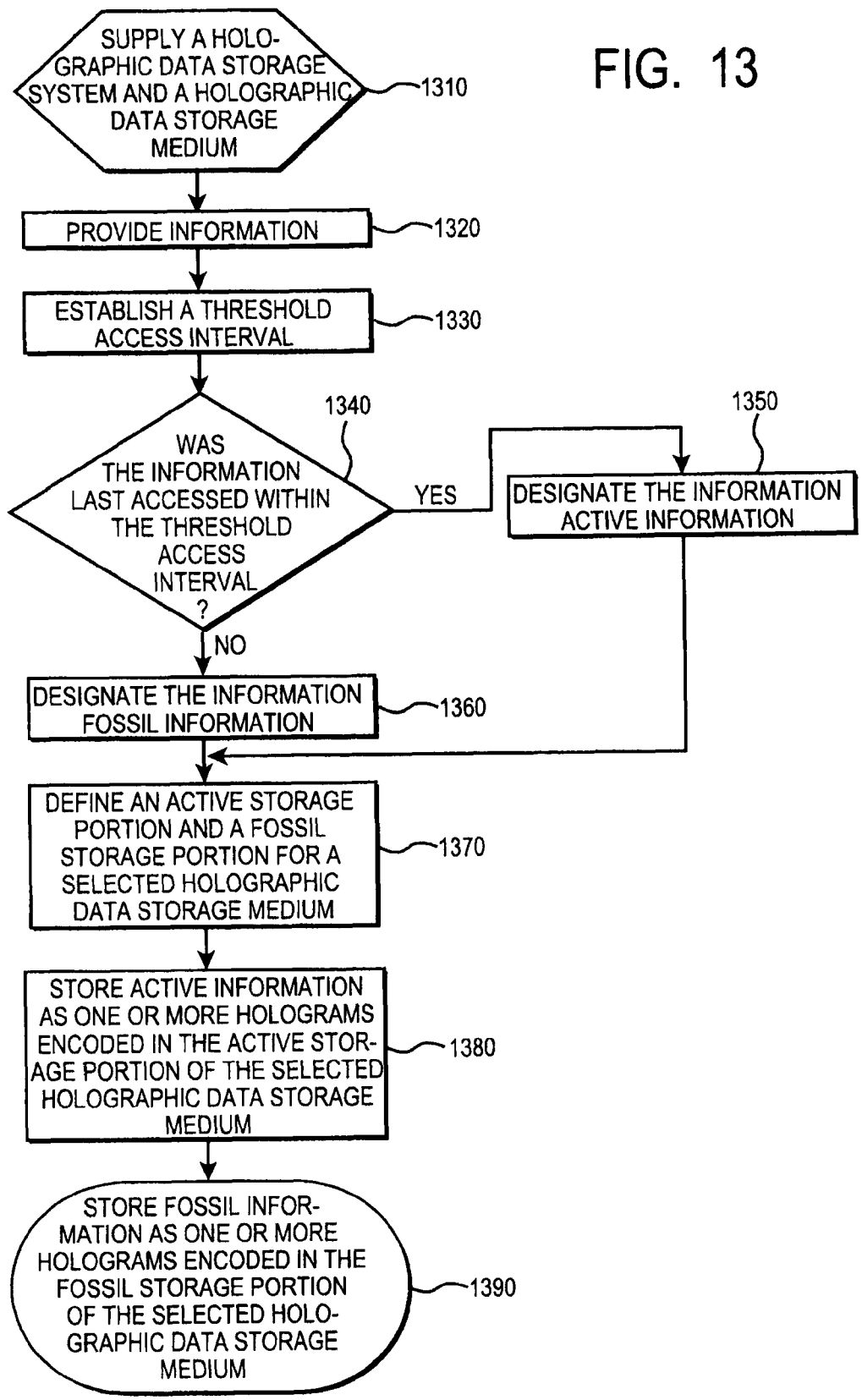
FIG. 13 is a flow chart summarizing the steps of a first embodiment of Applicants' method.

Referring to FIG. 13, in step 1310 the method supplies a holographic data storage medium and a holographic data storage system, such as and without limitation holographic data storage system 300 (FIGS. 3, 5), data storage and retrieval system 700 (FIG. 7), holographic drive 400 (FIGS. 4, 6), and/or holographic drive 900 (FIGS. 9, 10, 11).

In step 1320, the method provides information. In certain embodiments, step 1320 is performed by one or more host computers, such as and without limitation one or more of computing devices 710 (FIG. 7), 720 (FIG. 7), and/or 730 (FIG. 7). Step 1320 further comprises receiving the information. In certain embodiments, the information is received by a storage controller, such as storage controller 760 (FIG. 7). In certain embodiments, the information is received by a drive controller, such as drive controller 410 (FIGS. 4, 6, 9, 10, 11).

In step 1330, the method establishes a threshold access interval. In certain embodiments, the threshold access interval of step 1330 is set by the owner and/or operator of the computing device providing the information of step 1320. In certain embodiments, the threshold access interval of step 1330 is set by the owner and/or operator of the receiving data storage system, such as and without limitation the owner and/or operator of holographic data storage system 300 (FIGS. 3, 5), data storage and retrieval system 700 (FIG. 7), holographic drive 400 (FIGS. 4, 6), and/or holographic drive 900 (FIGS. 9, 10, 11). In certain embodiments, step 1330 is performed by a storage controller, such as storage controller 760 (FIG. 7). In certain embodiments, step 1330 is performed by a drive controller, such as drive controller 410 (FIGS. 4, 6, 9, 10, 11).

In step 1340, the method determines if the information of step 1320 was last accessed during the threshold access interval of step 1330. In certain embodiments, step 1340 is performed by a storage controller, such as storage controller 760 (FIG. 7). In certain embodiments, step 1340 is performed by a drive controller, such as drive controller 410 (FIGS. 4, 6, 9, 10, 11).

If the method determines in step 1340 that the information provided in step 1320 was last accessed during the threshold access interval of step 1330, then the method transitions from step 1340 to step 1350 wherein the method designates the information of step 1320 as Active information. The method transitions from step 1350 to step 1370. In certain embodiments, step 1350 is performed by a storage controller, such as storage controller 760 (FIG. 7). In certain embodiments, step 1350 is performed by a drive controller, such as drive controller 410 (FIGS. 4, 6, 9, 10, 11).

Alternatively, if the method determines in step 1340 that the information provided in step 1320 was not last accessed during the threshold access interval of step 1330, then the method transitions from step 1340 to step 1360 wherein the method designates the information of step 1320 as Fossil information. The method transitions from step 1360 to step 1370. In certain embodiments, step 1360 is performed by a storage controller, such as storage controller 760 (FIG. 7). In certain embodiments, step 1360 is performed by a drive controller, such as drive controller 410 (FIGS. 4, 6, 9, 10, 11).

In certain embodiments, the information of step 1320 comprises a plurality of individual files. In these embodiments, the method performs step 1340 and either step 1350 or step 1360, separately for each of the individual files.

In step 1370, the method defines a Fossil storage portion and an Active storage portion for a selected holographic data storage medium. In certain embodiments, the method in step 1320 calculates an Active-Fossil boundary radius $R_{AF}$ using equation (1) to define the Active storage portion and the Fossil storage portion. In certain embodiments, step 1370 is performed by a storage controller, such as storage controller 760 (FIG. 7). In certain embodiments, step 1370 is performed by a drive controller, such as drive controller 410 (FIGS. 4, 6, 9, 10, 11).

In step 1380 the method stores all files designated Active information in step 1350 as one or more holograms encoded in the Active storage portion of the selected holographic data storage medium. In certain embodiments, step 1380 is performed by a storage controller, such as storage controller 760 (FIG. 7). In certain embodiments, step 1380 is performed by a drive controller, such as drive controller 410 (FIGS. 4, 6, 9, 10, 11).

In step 1390 the method stores all files designated Fossil information in step 1360 as one or more holograms encoded in the Fossil storage portion of the selected holographic data storage medium. In certain embodiments, step 1390 is performed by a storage controller, such as storage controller 760 (FIG. 7). In certain embodiments, step 1390 is performed by a drive controller, such as drive controller 410 (FIGS. 4, 6, 9, 10, 11).

Figure 14:
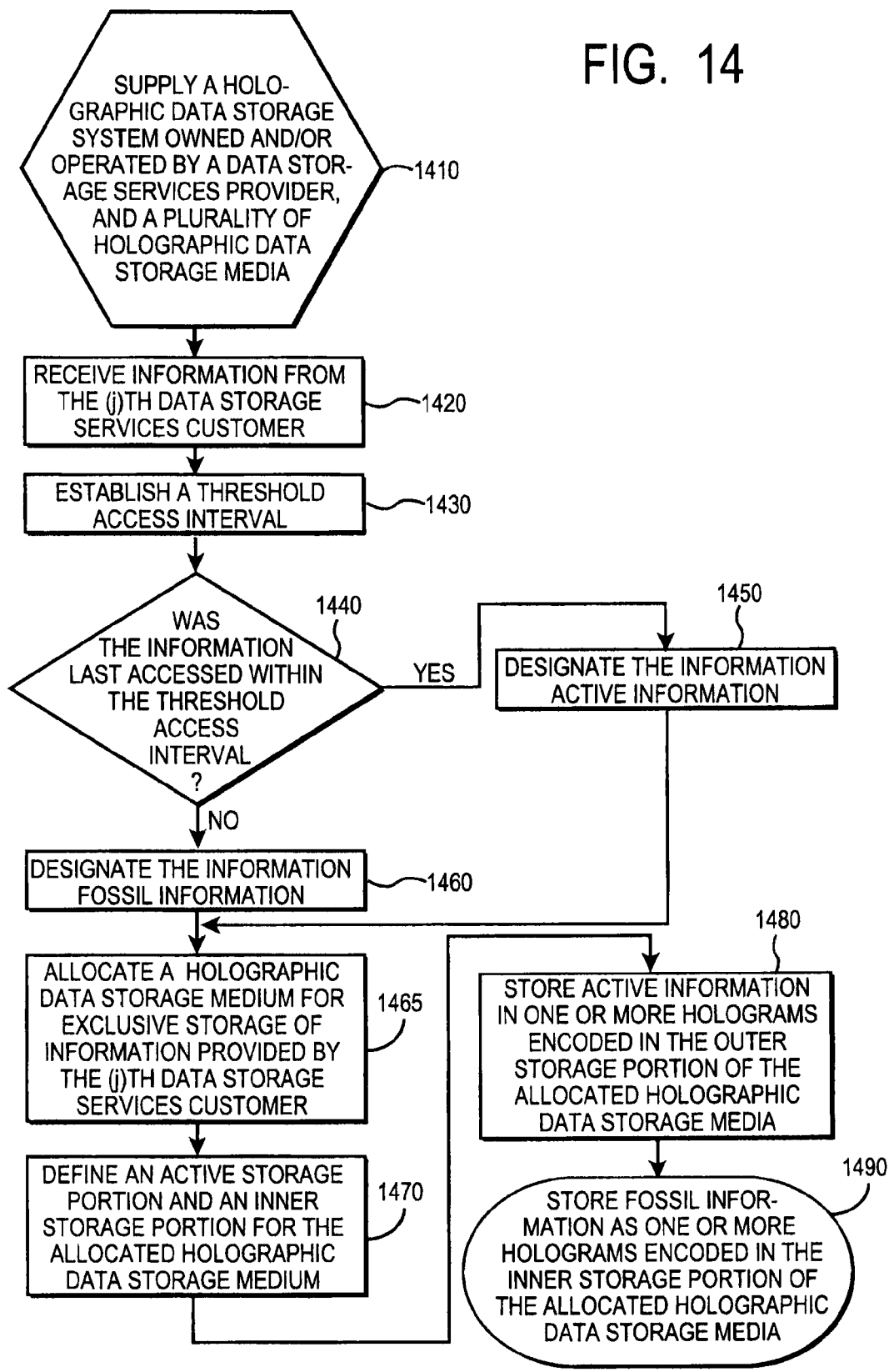
FIG. 14 is a flow chart summarizing the steps of a second embodiment of Applicants' method.

Applicants' method to store information using a holographic data storage medium further comprises a method to provide data storage services by a data storage services provider to (M) data storage services customers, wherein (M) is greater than or equal to 1. For example and referring once again to FIG. 7, in certain embodiments a data storage services customer owns and/or operates one or more of computing devices 710, 720, and 730. In these embodiments, a data storage services provider owns and operates fabric 740, and data storage system 700. FIG. 14 summarizes one embodiment of Applicants' method to provide data storage services by storing information in a holographic data storage medium.

Referring to FIG. 14, in step 1410 the method supplies a plurality of holographic data storage media and a holographic data storage system owned and operated by a data storage services provider, such as and without limitation holographic data storage system 300 (FIGS. 3, 5), data storage and retrieval system 700 (FIG. 7), holographic drive 400 (FIGS. 4, 6), and/or holographic drive 900 (FIGS. 9, 10, 11).

In step 1420, the method receives information from the (j)th data storage services customers, wherein (j) is greater than or equal to 1 and less than or equal to (M). In certain embodiments, step 1320 is performed by one or more computing devices owned by the (j)th data storage services customer, such as and without limitation one or more of computing devices 710 (FIG. 7), 720 (FIG. 7), and/or 730 (FIG. 7). Step 1420 further comprises receiving the information by the data storage services provider. In certain embodiments, the information is received by a storage controller, such as storage controller 760 (FIG. 7). In certain embodiments, the information is received by a drive controller, such as drive controller 410 (FIGS. 4, 6, 9, 10, 11).

In step 1430, the method establishes a threshold access interval. In certain embodiments, the threshold access interval of step 1430 is set by the data storage services customer providing the information of step 1420. In certain embodiments, the threshold access interval of step 1430 is set by the data storage services provider. In certain embodiments, step 1430 is performed by a storage controller, such as storage controller 760 (FIG. 7). In certain embodiments, step 1430 is performed by a drive controller, such as drive controller 410 (FIGS. 4, 6, 9, 10, 11).

In step 1440, the method determines if the information was last accessed during the threshold access interval of step 1430. In certain embodiments, step 1440 is performed by a storage controller, such as storage controller 760 (FIG. 7). In certain embodiments, step 1440 is performed by a drive controller, such as drive controller 410 (FIGS. 4, 6, 9, 10, 11).

If the method determines in step 1440 that the information provided in step 1420 was last accessed during the threshold access interval of step 1430, then the method transitions from step 1440 to step 1450 wherein the method designates the information of step 1420 as Active information. The method transitions from step 1450 to step 1465. In certain embodiments, step 1450 is performed by a storage controller, such as storage controller 760 (FIG. 7). In certain embodiments, step 1450 is performed by a drive controller, such as drive controller 410 (FIGS. 4, 6, 9, 10, 11).

Alternatively, if the method determines in step 1440 that the information provided in step 1420 was not last accessed during the threshold access interval of step 1430, then the method transitions from step 1440 to step 1460 wherein the method designates the information of step 1420 as Fossil information. The method transitions from step 1460 to step 1465. In certain embodiments, step 1460 is performed by a storage controller, such as storage controller 760 (FIG. 7). In certain embodiments, step 1460 is performed by a drive controller, such as drive controller 410 (FIGS. 4, 6, 9, 10, 11).

In certain embodiments, the information of step 1420 comprises a plurality of individual files. In these embodiments, the method performs step 1440 and either step 1450 or step 1460, separately for each of the individual files.

In step 1465, the method allocates one or more holographic data storage media for exclusive storage of information provided by the (j)th data storage services customer. In certain embodiments, step 1465 is performed by the data storage services provider. In certain embodiments, step 1465 is performed by a storage controller, such as storage controller 760 (FIG. 7). In certain embodiments, step 1465 is performed by a drive controller, such as drive controller 410 (FIGS. 4, 6, 9, 10, 11).

In step 1470, the method defines a Fossil storage portion and an Active storage portion for each of the allocated holographic data storage media of step 1465. In certain embodiments, the method in step 1470 calculates an Active-Fossil boundary radius $R_{AF}$ using equation (1) to define the Active storage portion and the Fossil storage portion. In certain embodiments, step 1470 is performed by a storage controller, such as storage controller 760 (FIG. 7). In certain embodiments, step 1470 is performed by a drive controller, such as drive controller 410 (FIGS. 4, 6, 9, 10, 11).

In step 1480 the method stores all files designated Active information in step 1450 as one or more holograms encoded in the Active storage portion of one or more of the allocated holographic data storage media of step 1465. In certain embodiments, step 1480 is performed by a storage controller, such as storage controller 760 (FIG. 7). In certain embodiments, step 1480 is performed by a drive controller, such as drive controller 410 (FIGS. 4, 6, 9, 10, 11).

In step 1490 the method stores all files designated Fossil information in step 1460 as one or more holograms encoded in the Fossil storage portion of the one or more allocated holographic data storage media of step 1465. In certain embodiments, step 1490 is performed by a storage controller, such as storage controller 760 (FIG. 7). In certain embodiments, step 1490 is performed by a drive controller, such as drive controller 410 (FIGS. 4, 6, 9, 10, 11).

Figure 8A:
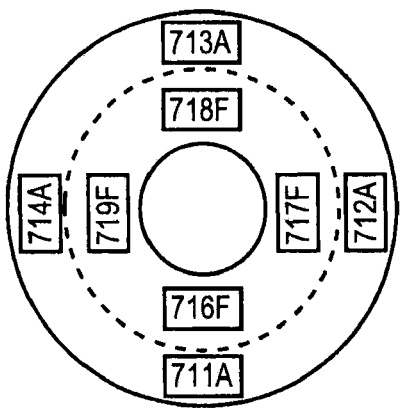
FIGS. 8A, 8B, and 8C, illustrate an implementation of Applicants' holographic RAID storage protocol.

Referring now to FIG. 8A, holographic data storage medium 810 comprises encoded holograms formed using information provided by computing device 710 (FIG. 7), holographic data storage medium 820 (FIG. 8B) comprises encoded holograms formed using information provided by computing device 720 (FIG. 7), and holographic data storage medium 830 (FIG. 8C) comprises encoded holograms formed using information provided by computing device 730 (FIG. 7). In the illustrated embodiment of FIG. 8, holographic data storage medium 810 comprises Fossil Holograms 716F, 717F, 718F, and 719F. In the illustrated embodiment of FIG. 8A, holographic data storage medium 810 further comprises Active Holograms 711A, 712A, 713A, and 714A.

Figure 8C:
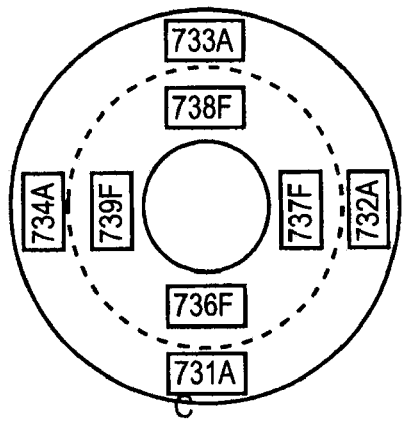
Figure 8B:
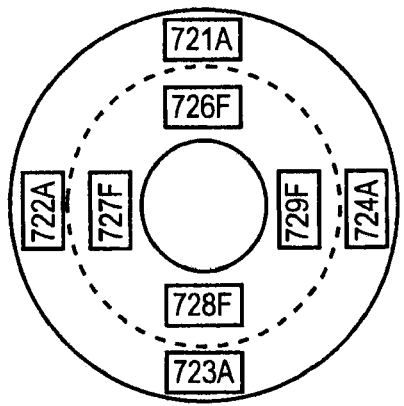

In the illustrated embodiment of FIG. 8B holographic data storage medium 820 comprises Fossil Holograms 726F, 727F, 728F, and 729F. In the illustrated embodiment of FIG. 8B, holographic data storage medium 820 further comprises Active Holograms 721A, 722A, 723A, and 724A.

In the illustrated embodiment of FIG. 8C holographic data storage medium 830 comprises Fossil Holograms 736F, 737F, 738F, and 739F. In the illustrated embodiment of FIG. 8C, holographic data storage medium 830 further comprises Active Holograms 731A, 732A, 733A, and 734A.

Figure 15:
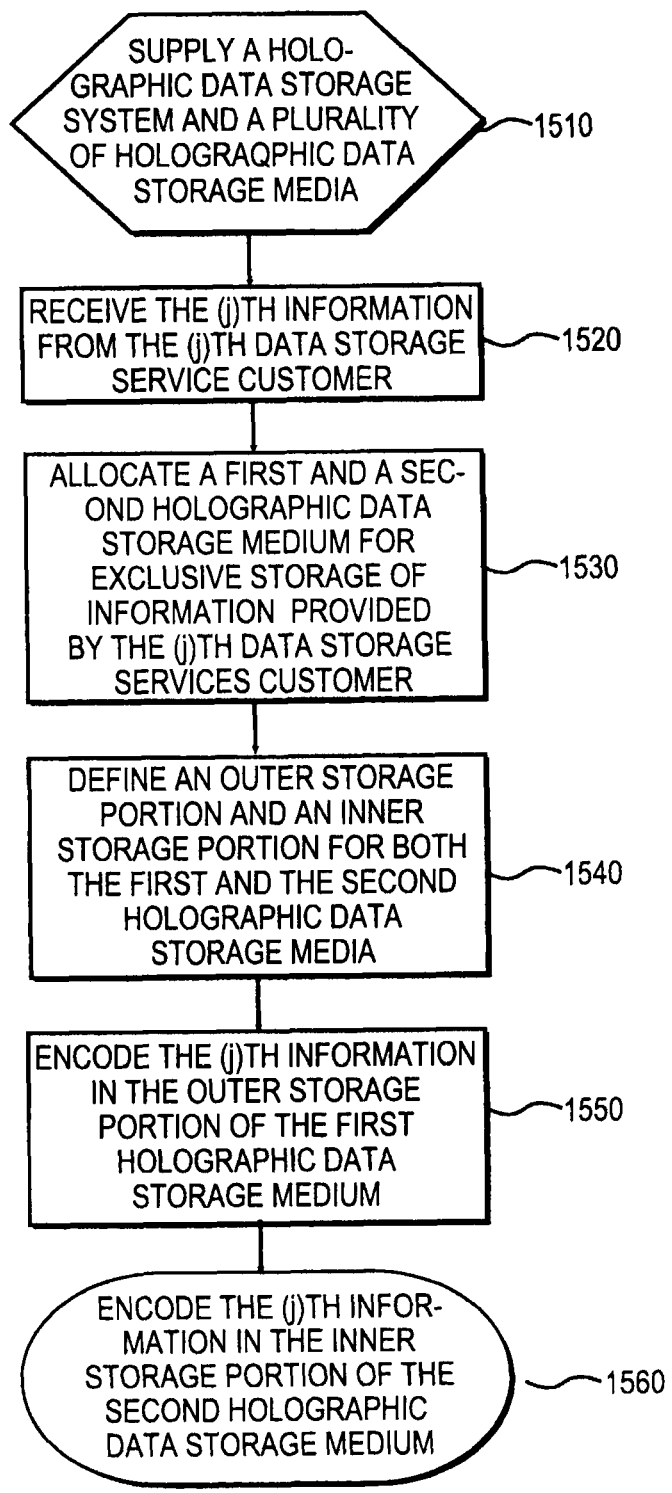
FIG. 15 is a flow chart summarizing the steps of a third embodiment of Applicants' method.

Applicants' method to store information using a holographic data storage medium further comprises a method to provide data storage services by a data storage services provider to (M) data storage services customers, wherein (M) is greater than or equal to 1. For example and referring once again to FIG. 7, in certain embodiments a data storage services customer owns and/or operates one or more of computing devices 710, 720, and 730. In these embodiments, a data storage services provider owns and operates fabric 740, and data storage system 700. FIG. 15 summarizes a second embodiment of Applicants' method to provide data storage services by storing information in a holographic data storage medium.

Referring to FIG. 15, in step 1510 the method supplies a plurality of holographic data storage media and a holographic data storage system, such as and without limitation holographic data storage system 300 (FIGS. 3, 5), data storage and retrieval system 700 (FIG. 7), holographic drive 400 (FIGS. 4, 6), and/or holographic drive 900 (FIGS. 9, 10, 11).

In step 1520, the method receives information from the (j)th data storage services customers, wherein (j) is greater than or equal to 1 and less than or equal to (M). In certain embodiments, step 1520 is performed by one or more computing devices owned by the (j)th data storage services customer, such as and without limitation one or more of computing devices 710 (FIG. 7), 720 (FIG. 7), and/or 730 (FIG. 7). Step 1520 further comprises receiving the information by the data storage services provider. In certain embodiments, the information is received by a storage controller, such as storage controller 760 (FIG. 7). In certain embodiments, the information is received by a drive controller, such as drive controller 410 (FIGS. 4, 6, 9, 10, 11).

In step 1530, the method allocates a first holographic data storage medium and a second holographic data storage medium for exclusive storage of information provided by the (j)th data storage services customer. In certain embodiments, step 1530 is performed by the data storage services provider. In certain embodiments, step 1530 is performed by a storage controller, such as storage controller 760 (FIG. 7). In certain embodiments, step 1530 is performed by a drive controller, such as drive controller 410 (FIGS. 4, 6, 9, 10, 11).

In step 1540, the method defines an inner storage portion and an outer storage portion for both the first data storage medium of step 1530 and for the second data storage medium of step 1530. In certain embodiments, the method in step 1540 calculates a boundary radius $R_{AF}$ using equation (1) to define the inner storage portion and the outer storage portion of both the first holographic data storage medium and the second holographic data storage medium. In certain embodiments, step 1540 is performed by a storage controller, such as storage controller 760 (FIG. 7). In certain embodiments, step 1540 is performed by a drive controller, such as drive controller 410 (FIGS. 4, 6, 9, 10, 11).

In step 1550, the method stores the (j)th customer information of step 1520 as one or more holograms encoded in the outer storage portion of the first holographic data storage medium of step 1530. In certain embodiments, step 1550 is performed by a storage controller, such as storage controller 760 (FIG. 7). In certain embodiments, step 1550 is performed by a drive controller, such as drive controller 410 (FIGS. 4, 6, 9, 10, 11).

In step 1560, the method stores the (j)th customer information of step 1520 as one or more holograms encoded in the inner storage portion of the second holographic data storage medium of step 1530. In certain embodiments, step 1560 is performed by a storage controller, such as storage controller 760 (FIG. 7). In certain embodiments, step 1560 is performed by a drive controller, such as drive controller 410 (FIGS. 4, 6, 9, 10, 11).

In certain embodiments, individual steps recited in FIGS. 13, 14, and/or 15, may be combined, eliminated, or reordered.

In certain embodiments, Applicants' invention includes instructions, such as instructions 824 (FIG. 7), encoded in memory 763 (FIG. 7), and/or instructions 437 (FIGS. 4, 6) encoded in memory 430, where those instructions are executed by a programmable computer processor, such as programmable computer processor 764 (FIG. 7) and/or programmable computer processor 420 (FIGS. 4, 6, 9, 10, 11), respectively, to perform one or more of steps 1320, 1330, 1340, 1350, 1360, 1370, 1380, and/or 1390, recited in FIG. 13, and/or one or more to steps 1420, 1430, 1440, 1450, 1460, 1465, 1470, 1480, and/or 1490, recited in FIG. 14, and/or one or more of steps 1510, 1520, 1530, 1540, 1550, and/or 1560, recited in FIG. 15.

In certain embodiments, Applicants' invention includes instructions residing in any other computer program product, where those instructions are executed by a computer external to, or internal to holographic data storage system 300 (FIGS. 3, 5), holographic drive 400 (FIGS. 4, 6), data storage and retrieval system 700 (FIG. 7), and/or holographic drive 900 (FIGS. 9, 10, 11), to perform one or more of steps 1320, 1330, 1340, 1350, 1360, 1370, 1380, and/or 1390, recited in FIG. 13, and/or one or more to steps 1420, 1430, 1440, 1450, 1460, 1465, 1470, 1480, and/or 1490, recited in FIG. 14, and/or one or more of steps 1510, 1520, 1530, 1540, 1550, and/or 1560, recited in FIG. 15. In either case, the instructions may be encoded in an information storage medium comprising, for example, a magnetic information storage medium, an optical information storage medium, an electronic information storage medium, and the like. By "electronic storage media," Applicants mean, for example, a device such as a PROM, EPROM, EEPROM, Flash PROM, compactflash, smartmedia, and the like.

While the preferred embodiments of the present invention have been illustrated in detail, it should be apparent that modifications and adaptations to those embodiments may occur to one skilled in the art without departing from the scope of the present invention as set forth in the following claims.

We claim:

1. A method to provide data storage services by a data storage services provider to a data storage services customer by storing information in one or more holographic data storage media disposed in a holographic data storage system operated by said data storage services provider, wherein said holographic data storage system comprises a light source, a spatial light modulator, and a plurality of holographic data storage media, the method comprising:

receiving by said data storage services provider information provided by said data storage services customer;

allocating a first holographic data storage medium for exclusive storage of information provided by said data storage services customer, wherein said first data storage medium is one of said plurality of holographic data storage media;

defining an outer storage portion of said first allocated holographic data storage medium;

storing said information as one or more holograms encoded in said outer storage portion of said first holographic data storage medium.

2. The method of claim 1, further comprising:

allocating a second holographic data storage medium for exclusive storage of information provided by said data storage services customer, wherein said second data storage medium is one of said plurality of holographic data storage media;

defining a inner storage portion of said second allocated holographic data storage medium;

storing said information as one or more holograms encoded in said inner storage portion of said second holographic data storage medium.

3. The method of claim 2, wherein:
said defining an outer storage portion comprises:
calculating an Active-Fossil boundary radius $R_{AF}$ using the equation:

$$R_{AF}=[(R_O^2-R_I^2)/2]^{1/2}$$

wherein a portion of said first holographic data storage medium having a radius greater than said Active-Fossil boundary radius $R_{AF}$ is defined as said outer storage portion;

said defining an inner storage portion comprises:
calculating an Active-Fossil boundary radius $R_{AF}$ using the equation:

$$R_{AF}=[(R_O^2-R_I^2)/2]^{1/2}$$

wherein a portion of said second holographic data storage medium having a radius less than said Active-Fossil boundary radius $R_{AF}$ is defined as said inner storage portion.

4. An article of manufacture operated by a data storage services provider and comprising a light source, a spatial light modulator, a plurality of holographic data storage media, and a computer readable medium having computer readable program code disposed therein to provide data storage services to one or more data storage services customers by storing information in one or more holographic data storage media, the computer readable program code comprising a series of computer readable program steps to effect:
 receiving information from a data storage services customer;
 allocating a first holographic data storage medium for exclusive storage of information provided by said data storage services customer;
 defining an outer storage portion of said first allocated holographic data storage medium;
 storing said information as one or more holograms encoded in said outer storage portion of said first holographic data storage medium.

5. The article of manufacture of claim 4, said computer readable program code further comprising a series of computer readable program steps to effect:
 allocating a second holographic data storage medium for exclusive storage of information provided by said data storage services customer;
 defining an inner storage portion of said second holographic data storage medium;
 storing said information as one or more holograms encoded in said inner storage portion of said second holographic data storage medium.

6. The article of manufacture of claim 5, wherein:
said computer readable program code to define said outer storage portion further comprises a series of computer readable program steps to effect:
calculating an Active-Fossil boundary radius $R_{AF}$ using the equation:

$$R_{AF}=[(R_O^2-R_I^2)/2]^{1/2}$$

defining a portion of said holographic data storage medium having a radius greater than said Active-Fossil boundary radius $R_{AF}$ as said outer storage portion;
said computer readable program code to define said inner storage portion further comprises a series of computer readable program steps to effect:
calculating an Active-Fossil boundary radius $R_{AF}$ using the equation:

$$R_{AF}=[(R_O^2-R_I^2)/2]^{1/2}$$

defining a portion of said holographic data storage medium having a radius less than said Active-Fossil boundary radius $R_{AF}$ as said inner storage portion.

7. A computer program product encoded in a computer readable medium and usable with a programmable computer processor disposed in a holographic data storage system comprising a light source, a spatial light modulator, and a plurality of holographic data storage media, comprising:
 computer readable program code which causes said programmable computer processor to receive information from a data storage services customer;
 computer readable program code which causes said programmable computer processor to allocate a first holographic data storage medium for exclusive storage of information provided by said data storage services customer;
 computer readable program code which causes said programmable computer processor to define an outer storage portion of said first allocated holographic data storage medium;
 computer readable program code which causes said programmable computer processor to store said information as one or more holograms encoded in said outer storage portion of said first holographic data storage medium.

8. The computer program product of claim 7, further comprising:
 computer readable program code which causes said programmable computer processor to allocate a second holographic data storage medium for exclusive storage of information provided by said data storage services customer;
 computer readable program code which causes said programmable computer processor to define an inner storage portion of said second holographic data storage medium;
 computer readable program code which causes said programmable computer processor to store said information as one or more holograms encoded in said inner storage portion of said second holographic data storage medium.

9. The computer program product of claim 8, wherein:
said computer readable program code which causes said programmable computer processor to define said outer storage portion further comprises computer readable program code which causes said programmable computer processor to:
calculate an Active-Fossil boundary radius $R_{AF}$ using the equation:

$$R_{AF}=[(R_O^2-R_I^2)/2]^{1/2}$$

define a portion of said holographic data storage medium having a radius greater than said Active-Fossil boundary radius $R_{AF}$ as said outer storage portion;
said computer readable program code which causes said programmable computer processor to define said inner storage portion further comprises computer readable program code which causes said programmable computer processor to:
calculate an Active-Fossil boundary radius $R_{AF}$ using the equation:

$$R_{AF}=[(R_O^2-R_I^2)/2]^{1/2}$$

define a portion of said holographic data storage medium having a radius less than said Active-Fossil boundary radius $R_{AF}$ as said inner storage portion.

* * * * *